(12) United States Patent
Kim (10) Patent No.: US 9,048,609 B2
(45) Date of Patent: Jun. 2, 2015

(54) LASER EMITTER MODULE AND LASER DETECTING SYSTEM TO WHICH THE LASER EMITTER MODULE IS APPLIED

(71) Applicant: ELECTRONICS AND TELECOMMUNICATIONS RESEARCH INSTITUTE, Daejeon (KR)

(72) Inventor: Jong Deog Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 22 days.

(21) Appl. No.: 13/889,264

(22) Filed: May 7, 2013

(65) Prior Publication Data

US 2014/0169392 A1 Jun. 19, 2014

(30) Foreign Application Priority Data

Dec. 18, 2012 (KR) .................. 10-2012-0148672

(51) Int. Cl.
| | | |
|---|---|---|
| *H01S 3/10* | (2006.01) | |
| *H01S 3/23* | (2006.01) | |
| *H01S 3/13* | (2006.01) | |
| *H01S 5/00* | (2006.01) | |
| *G01S 7/484* | (2006.01) | |
| *G02B 27/09* | (2006.01) | |
| *G01S 17/02* | (2006.01) | |
| *G01S 7/481* | (2006.01) | |
| *H01S 5/062* | (2006.01) | |
| *H01S 5/40* | (2006.01) | |

(52) U.S. Cl.
CPC . *H01S 5/005* (2013.01); *H01S 3/10* (2013.01); *H01S 3/1305* (2013.01); *H01S 3/23* (2013.01); *H01S 5/06216* (2013.01); *H01S 5/4087* (2013.01); *G01S 7/484* (2013.01); *G02B 27/0994* (2013.01); *G01S 17/026* (2013.01); *G01S 7/4815* (2013.01); *G01S 7/4816* (2013.01)

(58) Field of Classification Search
CPC ............ H01S 3/10; H01S 3/23; H01S 3/1305
USPC ................... 372/29.01, 29.011, 38.01, 38.02
See application file for complete search history.

(56) References Cited

U.S. PATENT DOCUMENTS

| 2012/0016615 | A1 | 1/2012 | Carpaij et al. | |
|---|---|---|---|---|
| 2012/0176554 | A1* | 7/2012 | Bilbao ......................... | 348/739 |

FOREIGN PATENT DOCUMENTS

| KR | 10-2009-0011399 A | 2/2009 |
|---|---|---|
| KR | 10-2011-0105010 A | 9/2011 |
| KR | 10-1071362 B1 | 10/2011 |

* cited by examiner

*Primary Examiner* — Armando Rodriguez (57) ABSTRACT

A laser emitter module may include a first laser emitter configured to output first laser beam having a first radiation angle by receiving first input laser beam and a second laser emitter configured to output second laser beam having a radiation angle different from the first radiation angle by receiving second input laser beam having a width different from that of the first input laser beam. The first and second laser emitters output the first and second laser beam together.

12 Claims, 9 Drawing Sheets

Fig. 8

LASER EMITTER MODULE AND LASER DETECTING SYSTEM TO WHICH THE LASER EMITTER MODULE IS APPLIED

CROSS-REFERENCE TO RELATED APPLICATIONS

This US non-provisional patent application claims priority under 35 USC §119 to Korean Patent Application No. 10-2012-0148672, filed on Dec. 18, 2012, the entirety of which is hereby incorporated by reference.

BACKGROUND OF THE INVENTION

Exemplary embodiments of inventive concepts relate to laser detecting systems and, more particularly, to a laser emitter module to output a plurality of laser beams and a laser detecting system to which the laser emitter module is applied.

With the advance in automotive industry, user support systems such as unmanned driving systems have attracted much attention. A user may conveniently perform a work using a user support system. If the user support system is used, improve stability is provided. Especially, unmanned support systems such as an unmanned driving system and an unmanned robot system may support spatial shift and work without depending on user's control.

Such unmanned support systems use sensors to replace user's cognitive functions. For example, a Lidar has been provided to detect spatial images and spatial distance. In particular, laser sensors for use in unmanned driving systems may obtain distance information and image information of a far-off object without being affected by an ambient lighting condition.

However, such Lidars have fixed field of view and angle resolution. Therefore, the Lidars are different in detectable size and accuracy of an object according to detection distance. As a result, use of a plurality of Lidars is required to ensure sufficient field of view or angle resolution according to detection distance range. In addition, a laser scanner uses a plurality of lasers and a plurality of photodiodes to ensure a sufficient angle resolution at a field of view. In addition, a flash Lidar requires a great number of photodiode array pixels. Besides these limitations, since different optical systems are applied to ensure field of view required according to detection distance, manufacturing of a conventional laser detection module supporting a plurality of fields of view causes difficulty in miniaturization and incurs high costs.

SUMMARY OF THE INVENTION

Exemplary embodiments of inventive concepts provide a laser emitter module and a laser detecting system to which the laser emitter module is applied.

According to an embodiment of the inventive concept, a laser emitter module may include a first laser emitter configured to output first laser beam having a first radiation angle by receiving first input laser beam; and a second laser emitter configured to output second laser beam having a radiation angle different from the first radiation angle by receiving second input laser beam having a width different from that of the first input laser beam. The first and second laser emitters output the first and second laser beam together.

In an exemplary embodiment, output terminals of the first and second laser emitters may have different radii of curvature.

In an exemplary embodiment, the greater the radii of curvature radii the output terminals of the first and second laser emitters, the greater the first and second radiation angles of the first and second laser beams.

In an exemplary embodiment, the first and second laser emitters may include waveguides of different structures, and sizes of the first and second radiation angles may be adjusted depending on the structures of the waveguides.

In an exemplary embodiment, the greater output terminals of the waveguides included in the first and second laser emitters, the smaller the sizes of the first and second radiation angles.

In an exemplary embodiment, laser outputting directions of the first and second laser emitters may be different from each other.

In an exemplary embodiment, the laser emitter module may further include third to $n^{th}$ laser emitters configured to output third to $n^{th}$ laser beams having third to $n^{th}$ radiation angles differing from the first and second radiation angles.

According to an embodiment of the inventive concept, a laser detecting system may include a laser transmission unit configured to output first output laser beam having a first radiation angle and second laser beam having a second radiation angle together; a laser detection unit configured to detect an observation target by receiving first and second reflected laser beams generated by reflecting the first and second output laser beams from the observation target; and a control analysis unit to control the laser transmission unit by receiving a detection result of the laser detection unit. The first and second radiation angles are different from each other.

In an exemplary embodiment, the laser transmission unit may include a laser generator configured to generate first and second input laser beams according to the control of the laser analysis unit; and a laser emitter module configured to output first and second output laser beams having first and second radiation angles by receiving the first and second input laser beams.

In an exemplary embodiment, the laser detection unit may include a detector optical system configured to receive the first and second reflected laser beams and concentrate the received first and second reflected laser beams to output concentrated laser beam; a width division modulation filter configured to receive the concentrated laser beam and divide the received concentrated laser beam into the first and second reflected laser beams; and first and second detectors configured to detect the observation target by receiving the first and second reflected laser beams from the width division modulation filter, respectively.

In an exemplary embodiment, the detector optical system may include an optical noise filter configured to remove optical noise included in the first and second reflected laser beams.

In an exemplary embodiment, the first detection unit may detect an observation target located a predetermined distance or longer and the second detection unit may detect an observation target located a predetermined distance or shorter when the first radiation angle is smaller than the second radiation angle.

In an exemplary embodiment, the laser analysis unit may receive a detection result of the laser detection unit and transmit the detection result to an external device.

In an exemplary embodiment, the first and second output laser beams may be output together for a first time and may not be output together for a second time.

In an exemplary embodiment, the control analysis unit may not output the first and second output laser beams after the first output laser beams is output for a predetermined time and may not output the first and second laser beams after the second output laser beam is output for a predetermined time after the lapse of the first time.

In an exemplary embodiment, the first and second times may be decided based on times of flight (TOF) of the first and second output laser beams.

In an exemplary embodiment, the laser detection unit may include a single detection unit configured to detect the observation target. The single detection unit may detect the observation target by receiving the first reflected laser beam for a first time and detect the observation target by receiving the second reflected laser beam for a second time.

BRIEF DESCRIPTION OF THE DRAWINGS

Inventive concepts will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of inventive concepts.

DETAILED DESCRIPTION

Exemplary embodiments of the inventive concepts will now be described more fully with reference to the accompanying drawings, in which exemplary embodiments of the inventive concept are shown. Exemplary embodiments of the inventive concept may, however, be embodied in many different forms and should not be construed as limited to the embodiments set forth herein. Rather, these exemplary embodiments of the inventive concepts are provided so that this description will be thorough and complete, and will fully convey the concept of exemplary embodiments of the inventive concepts to those of ordinary skill in the art.

A laser detecting system according to the inventive concept includes a laser transmission unit to transmit laser beams having different radiation angles and a laser detection unit to detect laser beams having different widths. The laser detecting system provides short-distance detection of wide field of view and long-distance detection of narrow field of view using different radiation angles. Thus, performance of the laser detecting system is enhanced and the cost thereof is reduced.

Figure 1:
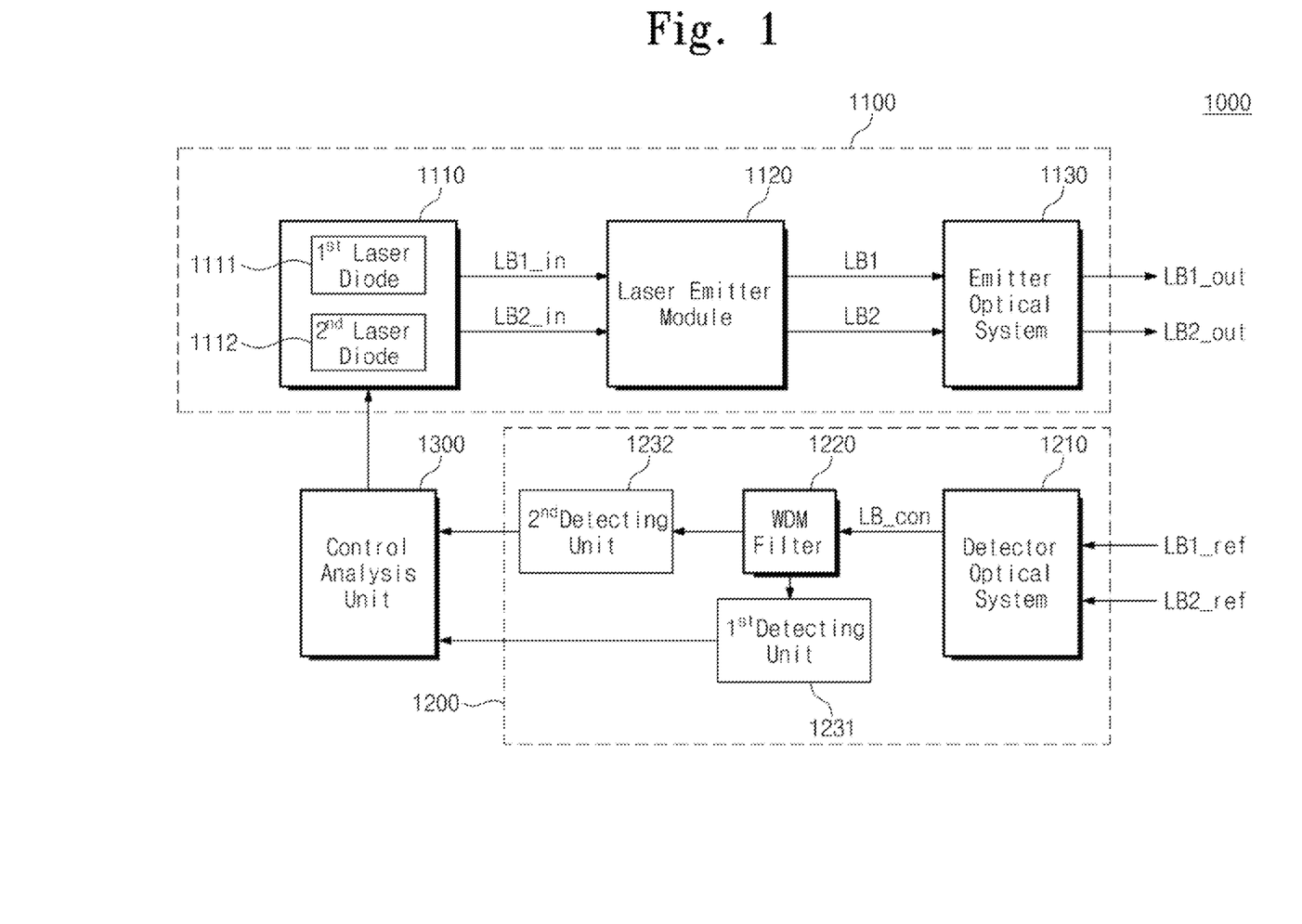
FIG. 1 is a block diagram of a laser detecting system according to an embodiment of the inventive concept.

FIG. 1 is a block diagram for showing a laser detecting system 100 according to an embodiment of the inventive concept. In an exemplary embodiment, the laser detecting system 1000 operates based on first and second laser beams LB1 and LB2 having first and second widths $\lambda_1$ and $\lambda_2$, respectively. However, embodiments of the inventive concept are not limited thereto and a laser detecting system according to the inventive concept may operate based on a plurality of laser beams having different widths, respectively.

Referring to FIG. 1, the laser detecting system 1000 may provide detection of an observation target disposed in a short or long distance using a plurality of laser beams having different radiation angles and different widths, respectively. The laser detecting system 1000 includes a laser transmission unit 1100, a laser detecting unit 1200, and a control analysis unit 1300.

The laser transmission unit 1100 includes a laser generator 1110, a laser emitter module 1120, and an emitter optical system 1130.

The laser generator 1110 may output first and second input laser beams LB1_in and LB2_in having different widths. For example, the laser generator 1110 includes first and second laser diodes 1111 and 1112. The first laser diode 1111 may output the first input laser beam LB1_in having a first width $\lambda_1$, and the second laser diode 1112 may output the second input laser beam LB2_in having a second width $\lambda_2$ that is different from the first width $\lambda_1$. The first and second input laser beams LB1_in and LB2_in output from the first and second laser diodes 1111 and 1112 are transmitted to the laser emitter module 1120.

The laser emitter module 1120 receives the first and second input laser beams LB1_in and LB2_in to output first and second laser beams LB1 and LB2 having different radiation angles, respectively. For example, the laser emitter module 1120 may output the first and second input laser beams LB1_in and LB2_in received from the laser generator 1110 as the first and second laser beams LB1 and LB through a plurality of channels.

In an exemplary embodiment, the laser emitter module 1120 may include a plurality of laser emitters. In an exemplary embodiment, the radiation angles of the first and second laser beams LB1 and LB2 may be differently adjusted depending on widths of the first and second input laser beams LB1_in and LB2_in, a radius of curvature of output terminals of a plurality of laser emitters incorporated in the laser emitter module 1120 or the structure of waveguides of a plurality of emitters included in the laser emitter module 1120. The laser emitter module 1120 will be described later in detail with reference to FIGS. 2A to 4.

The emitter optical system 1130 may receive the first and second laser beams LB1 and LB2 from the laser emitter module 1120 to output first and second output laser beams LB1_out and LB2_out. In an exemplary embodiment, the emitter optical system 1130 adjusts radiation angles of the received first and second laser beams LB1 and LB2 to output first and second output laser beams LB1_out and LB2_out having different final radiation angles, respectively. In an exemplary embodiment, the emitter optical system 1130 may include a plurality of lenses. The emitter's optical system 1130 may include a structure assembled a plurality of lenses.

Continuing to refer to FIG. 1, the laser detection unit 1200 includes a detector optical system 1210, a width division modulation (WDM) filter 1220, and first and second detection units 1231 and 1232.

The detector optical system 1210 receives first and second reflected laser beams LB1_ref and LB2_ref. In an exemplary embodiment, the first and second reflected laser beams LB1_ref and LB2_ref are laser beams generated when the first and second output laser beams LB1_out and LB2_out are reflected from the observation target. The detector optical system 1210 concentrate the received first and second reflected laser beams LB1_ref and LB2_ref to output concentrated laser beam LB_con. The concentrated laser beam LB_con is transmitted to the WDM filter 1220. In an exemplary embodiment, the concentrated laser beam LB_con includes first and second reflected laser beams LB1_ref and LB2_ref. In an exemplary embodiment, the detector optical system 1210 may include a filter(not shown) to remove nose light included in the first and second reflected laser beams LB1_ref and LB2_ref.

The WDM filter 1220 may divide the received concentrated laser beam LB_con depending on each width. For example, the concentrated laser beam LB_con may include first and second reflected laser beams LB1_ref and LB2_ref. The first reflected laser beam LB1_ref may have a first width $\lambda_1$, and the second reflected laser beam LB2_ref may have a second width $\lambda_2$ that is different from the first width $\lambda_1$. The WDM filter 1220 may divide the concentrated laser beam LB_con to transmit the first reflected laser beam LB1_ref having the first width $\lambda_1$ to the first detection unit 1231 and transmit the second reflected laser beam LB2_ref having the second width $\lambda_2$ to the second detection unit 1232.

The first and second detection units 1231 and 1232 may detect an observation target spaced apart therefrom by a predetermined distance, based on the received first and second reflected laser beams LB1_ref and LB2_ref. For example, the first detection unit 1231 may include a photodiode array (PD) with an m×n structure. The photodiode array with an m×n structure may be a device that is more suitable for long-distance detection. The second detection unit 1232 may include a photodiode array with a j×k structure. The photodiode array with a j×k structure may be a device that is more suitable for short-distance detection. In this case, if a distance between the laser detecting system 1000 and an observation target is equal to or longer than a certain distance, the first detection unit 1231 may detect the observation target. Meanwhile, if the distance between the laser detecting system 1000 and an observation target is equal to or shorter than a certain distance, the second detection unit 1232 may detect the observation target. In other words, the first and second detection units 1231 and 1232 may have different resolutions and detect observation targets that are located different distances, respectively.

Continuing to refer to FIG. 1, the control analysis unit 1300 may control the laser generator 1110. For example, the control analysis unit 1300 may control the first and second laser diodes 1111 and 1112. In an exemplary embodiment, the control analysis unit 1300 may receive outputs of the first and second detection units 1231 and 1232 and transmit the received outputs to an external device (not shown).

The above-described laser detecting system 1000 according to the embodiment of the inventive concept may transmit a plurality of laser beams having different widths and radiation angles and receive a plurality of reflected laser beams to detect an observation target that is located a long or short distance. Thus, performance of the laser detecting system is enhanced and the cost thereof is reduced.

Hereinafter, a laser emitter module will be described more fully with reference to FIGS. 2A to 4. For the brevity of description, let it be assumed that laser beams explained below adjusts a radiation angle in a direction perpendicular to an axis direction of laser beams output from laser emitters (e.g., a direction perpendicular to the ground). However, the scope of the inventive concept is not limited thereto and a laser detecting system according to the inventive concept may also detect a radiation angle in a different direction (e.g., a direction horizontal to the ground).

Figure 2A:
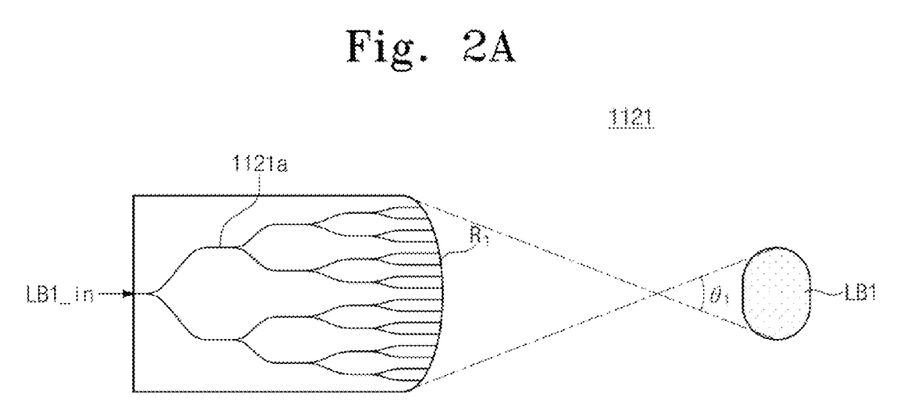
FIGS. 2A and 2B are diagrams illustrating first and second laser emitters included in a laser emitter module in FIG. 1, respectively.
Figure 2B:
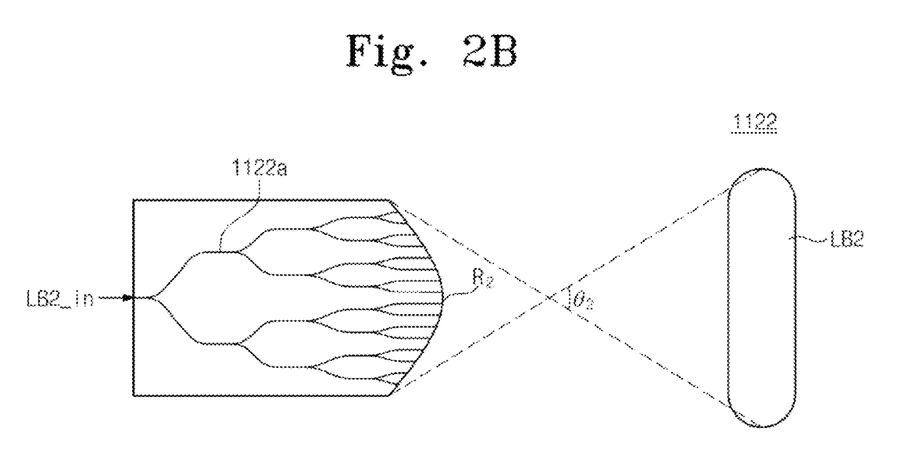

FIGS. 2A and 2B are diagrams illustrating first and second laser emitters included in a laser emitter module in FIG. 1, respectively. In an exemplary embodiment, the first and second laser emitters 1121 and 1122 are incorporated in the laser emitter module 1120 shown in FIG. 1.

Referring to FIG. 2A, the first laser emitter 1121 receives first input laser beam LB1_in. The first laser emitter 1121 includes a first waveguide 1121a. The first waveguide 1121a provides a plurality of channels through which the first input laser beam LB1_in may be split. The first laser emitter 1121 outputs the received first input laser beam LB1_in as first laser beam LB1 split through the channels. In an exemplary embodiment, the first laser beam LB1 has a first radiation angle θ1. In an exemplary embodiment, an output terminal of the first laser emitter 1121 may have a first radius of curvature of $R_1$. In an exemplary embodiment, the first laser emitters 1121 may be provided based on a light splitter of planar lightwave circuit (PLC) structure.

Referring to FIG. 2B, the second laser emitter 1122 receives second input laser beam LB2_in. The second laser emitter 1122 includes a second waveguide 1122a. The second waveguide 1122a provides a plurality of channels through which the second input laser beam LB2_in may be split. The second laser emitter 1122 outputs the received second input laser beam LB2_in as first laser beam LB1 split through the channels. In an exemplary embodiment, the second laser beam LB2 has a second radiation angle θ2. In an exemplary embodiment, an output terminal of the second laser emitter 1122 may have a second radius of curvature of $R_2$. In an exemplary embodiment, the second laser emitters 1121 may be provided based on a light splitter of planar lightwave circuit (PLC) structure.

As described with reference to FIGS. 2A and 2B, the first and second laser emitters 1121 and 1122 have different radius of curvature. In an exemplary embodiment, the first and second laser beams LB1 and LB2 having different radiation angles may be output by adjusting radii of curvature of the first and second laser emitters 1121 and 1122. For example, if a first radius of curvature $R_1$ is greater than a second radius of curvature $R_2$, a first radiation angle θ1 is smaller than a second radiation angle θ2. In other words, the greater a radius of curvature of an output terminal of a laser emitter, the smaller a radiation angle of emitted laser beam.

In an exemplary embodiment, the first and second radii of curvature $R_1$ and $R_2$ of the first and second laser emitters 1121 and 1122 shown in FIGS. 2A and 2B have a convex structure. However, the scope of the inventive concept is not limited thereto and the first and second curvature radii $R_1$ and $R_2$ may have a flat structure or a concave structure.

Figure 2C:
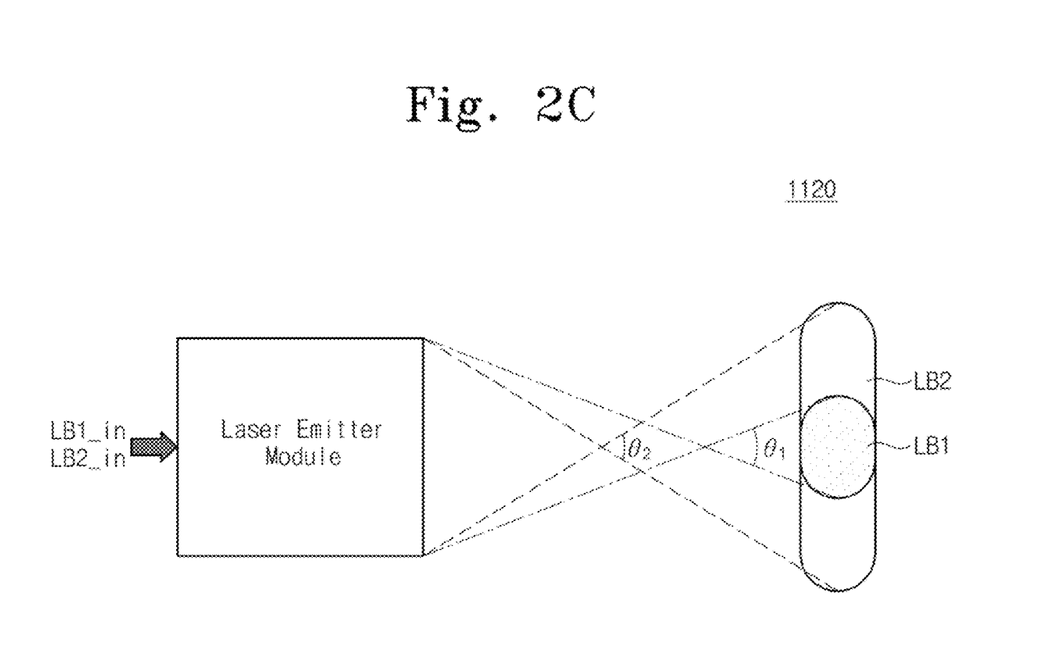
FIG. 2C is a diagram illustrating a laser emitter module in FIG. 1.

FIG. 2C is a diagram illustrating a laser emitter module in FIG. 1. Referring to FIG. 2C, the laser emitter module 1120 includes the first and second laser emitters 1121 and 1122 explained with reference to FIGS. 2A and 2B. The laser emitter module 1120 receives first and second input laser beams LB1_in and LB2_in to output first and second laser beams LB1 and LB2. For example, the first laser emitter 1121 receives the first input laser beam LB1_in to output the first laser beam LB1 having a first radiation angle θ1, and the second laser emitter 1122 receives the second input laser beam LB2_in to output the second laser beam LB2 having a second radiation angle θ2. That is, the first and second laser beams LB1 and LB2 have different radiation angles.

In an exemplary embodiment, let it be assumed that horizontal-direction positions of the first and second laser beams LB1 and LB2 shown in FIG. 2C are identical to each other. However, the scope of the inventive concept is not limited thereto and the horizontal-direction positions of the first and second laser beams LB1 and LB2 may be different from each other.

In an exemplary embodiment, the first laser beam LB1 may be used to detect an observation target located a long distance, and the second laser beam LB2 may be used to detect an observation target located a short distance.

The above-described laser emitter module 1120 according to the embodiment of the inventive concept may output first laser beam LB1 for detecting a long-distance observation target and second laser beam LB2 for detecting a short-distance observation target together.

Figure 3A:
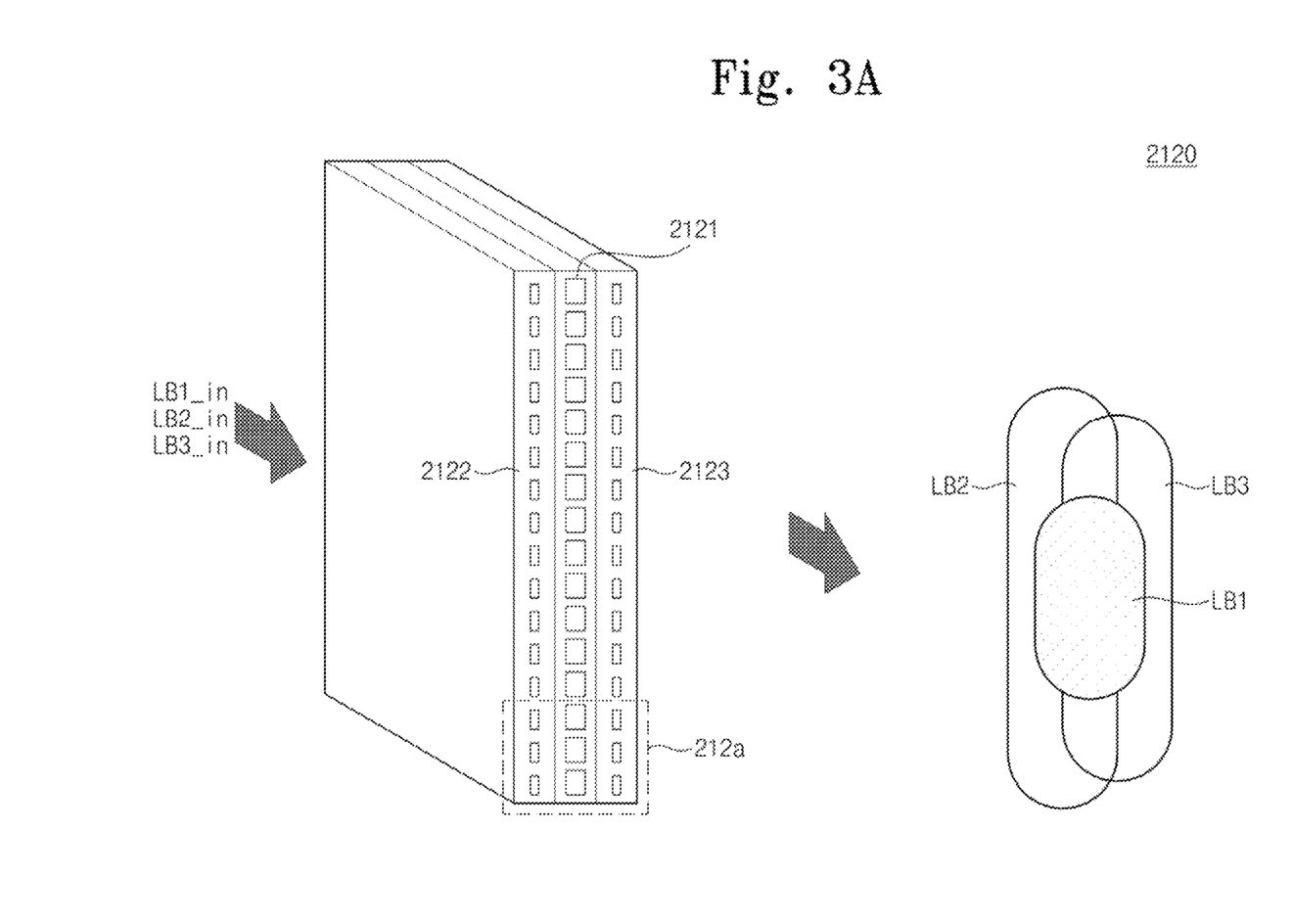
FIG. 3A is a diagram illustrating a laser emitter module according to another embodiment of the inventive concept.

FIG. 3A is a diagram illustrating a laser emitter module according to another embodiment of the inventive concept. As illustrated, the laser emitter module 2120 includes first to third laser emitters 2121 to 2123. The first to third laser emitters 2121 to 2123 receive first to third input laser beams LB1_in to LB3_in to output first to third laser beams LB1-LB3, respectively. For example, the second and third laser emitters 2122 and 2123 may include waveguides of the same structure. The second and third emitters 2122 and 2123 receive second and third input laser beams LB2_in and LB3_in to output second and third laser beams LB2 and LB3, respectively. The first laser emitter 2121 may include a waveguide having a structure which is different from the waveguides of the second and third laser emitters 2122 and 2123.

In an exemplary embodiment, the second and third input laser beams LB2_in and LB3_in have different widths. As a result, the second and third laser beams LB2 and LB3 may have different radiation angles even when the second and third laser emitters 2122 and 2123 have waveguides of the same structure. In other words, the laser emitter module 2120 may adjust width of input laser beam to adjust a radiation angle of output laser beam. In an exemplary embodiment, the longer width of input laser beam, the greater a radiation angle of output laser beam.

Figure 3B:
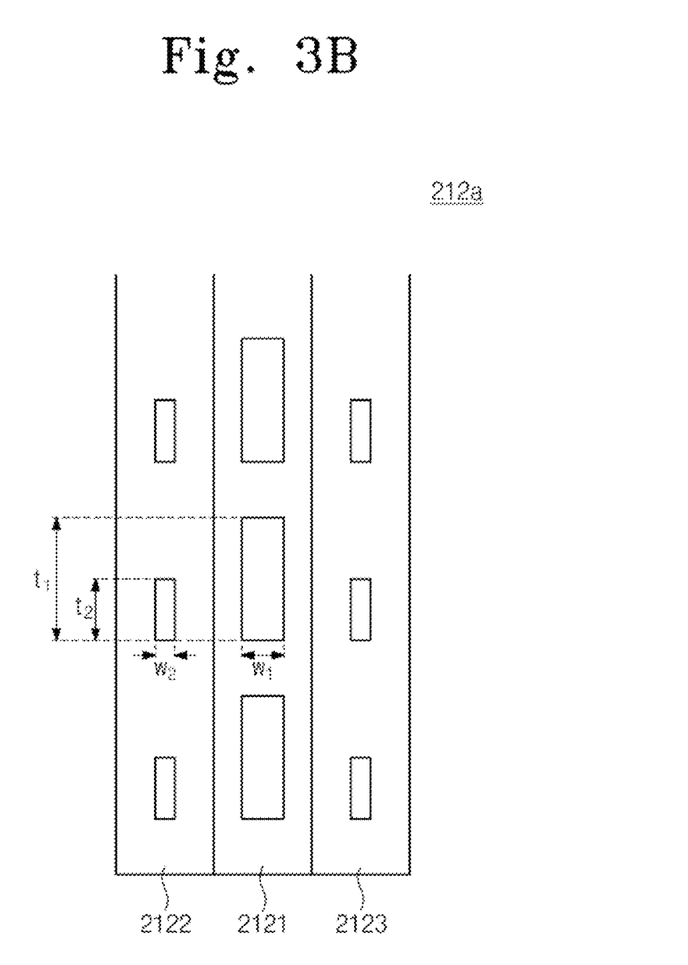
FIG. 3B is an enlarged view of a portion of the laser emitter module in FIG. 3A.

FIG. 3B is an enlarged view of a portion of the laser emitter module in FIG. 3A. In an exemplary embodiment, a relationship between a size of waveguide of a laser emitter and a radiation angle of laser beam will now be described below with reference to the region 212a shown in FIG. 3B.

Referring to FIGS. 3A and 3B, the first to third laser emitters 2121 to 2123 have waveguides of different sizes. For example, the waveguide of the first laser emitter 2121 has first width $w_1$ and first height $t_1$, and the waveguide of the second laser emitter 2122 has second width $w_2$ and second height $t_2$. A radiation angle of output laser beam may be adjusted by adjusting a size of waveguide included in a laser emitter. In an exemplary embodiment, the smaller a size of waveguide, the greater a radiation angle of output laser beam.

As described with reference to FIGS. 3A and 3B, a radiation angle of output laser beam may be adjusted by adjusting a size of waveguide included in a laser emitter or width of input laser beam. Thus, since a plurality of laser beams having different radiation angles may be used together, performance of a laser detecting system is enhanced and the cost thereof is reduced.

Figure 4:
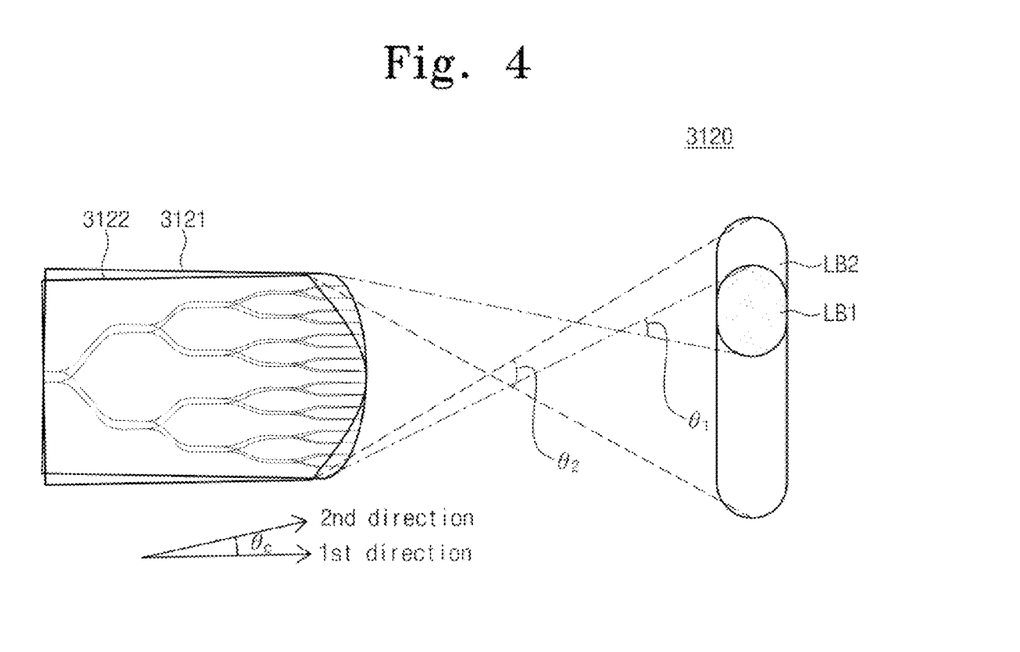
FIG. 4 is a diagram illustrating a laser emitter module according to still another embodiment of the inventive concept.

FIG. 4 is a diagram illustrating a laser emitter module according to another embodiment of the inventive concept. Referring to FIG. 4, the laser emitter module 3120 includes first and second laser emitters 3121 and 3122. Since the first and second laser emitters 3121 and 3122 have been explained with reference to FIGS. 2A and 2B, they will not be explained in further detail.

As compared to the laser emitter module 1120 shown in FIG. 2C, the laser emitter module 3120 is characterized in that output axis directions of the first and second laser emitters 3121 and 3122 have a difference of predetermined angle $θ_c$. In other words, the first laser emitter 3121 outputs first laser beam LB1 along an axis of first direction and the second laser emitter 3122 outputs second laser beam LB2 along an axis of second direction. The axis of the first direction and the axis of the second direction have a difference of predetermined angle $θ_c$.

According to the still another embodiment of the inventive concept, the laser emitter module 3120 differently adjusts angles of axis directions of laser beams output from a plurality of laser emitters to enhance detection performance of an observation target. For example, when an axis direction of laser beam output from laser emitters incorporated in the laser emitter module 3120 is inclined at a predetermined angle to a direction of the ground, detection performance of an observation target disposed adjacent to the ground may be enhanced.

Figure 5:
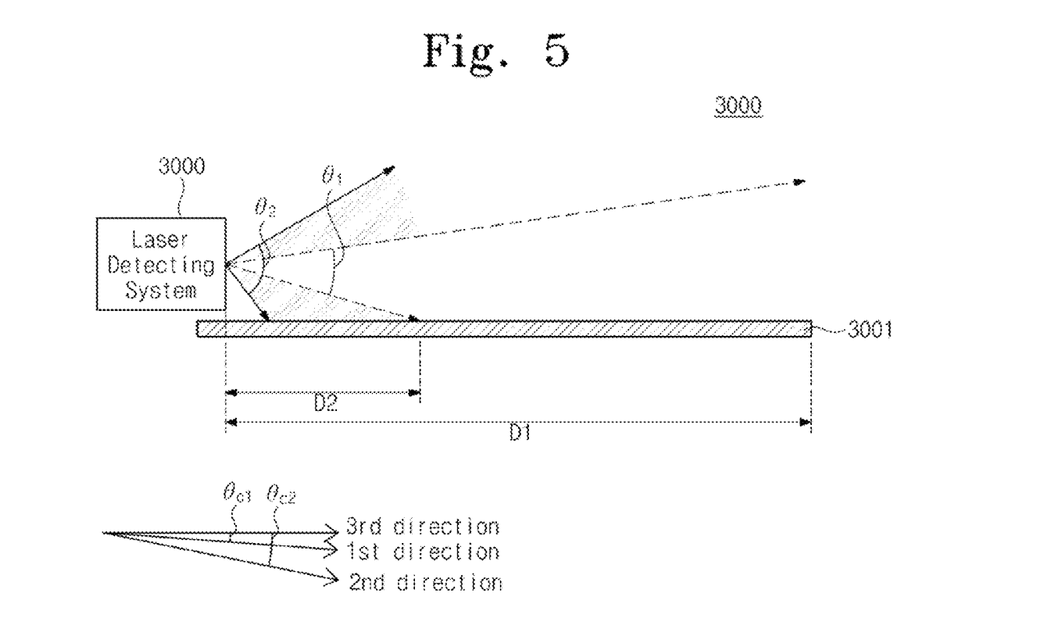
FIG. 5 is a diagram describing the operation of a laser detecting system to which the laser emitter module in FIG. 4 is applied.

FIG. 5 is a diagram describing the operation of a laser detecting system to which the laser emitter module in FIG. 4 is applied. Referring to FIG. 5, the laser detecting system 3000 may detect an observation target disposed in a direction parallel to the ground 3001. For example, the laser detecting system 3000 may detect an observation target located a long distance D1 or a short distance D2. The laser detecting system 3000 may detect an observation target located within the long distance D1, based on first laser beam having a first radiation angle θ1.

The first laser beam LB1 may have an output axis direction in an axis direction of first direction, and the second laser beam LB2 may have an output axis direction in an axis direction of second direction. In an exemplary embodiment, the axis of the first direction has a difference of first angle $θ_1$ with respect to an axis of third direction and the axis of the second direction has a difference of second angle $θ_2$ with respect to an axis of third direction. The axis of the third direction indicates a direction parallel to the ground 3001. In other words, the laser detecting system 3000 outputs the first and second laser beams LB1 and LB2 in a direction toward the ground 3001 to have a difference as much as the first and second angles $θ_1$ and $θ_2$. Thus, the laser detecting system 3000 enhances detection performance of an observation target located on the ground 3001.

According to the still embodiment of the inventive concept, the laser detecting system 3000 may enhance detection performance of an observation target located on the ground 3001 by adjusting a propagation direction of output laser beam.

Figure 6:
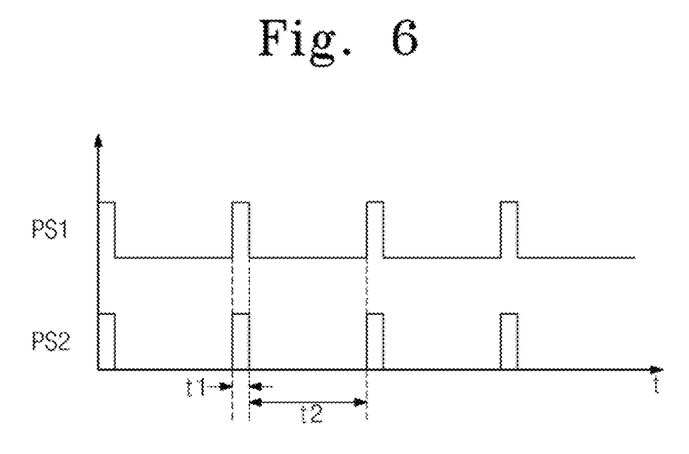
FIG. 6 is a timing diagram illustrating the operation of a laser detecting system according to still another embodiment of the inventive concept.

FIG. 6 is a timing diagram illustrating the operation of a laser detecting system 1000 according to still another embodiment of the inventive concept. In an exemplary embodiment, when first and second output laser beams LB1_out and LB2_out are simultaneously output, the laser detecting system 1000 may be unstabilized or the sum of intensities of the simultaneously output laser beams LB1_out and LB2_out may exceed the standard for physical protection due to instantaneous over-output.

Referring to FIGS. 1 and 6, first and second pulse signals PS1 and PS2 are signals to control a laser generator 1110. For example, a first laser diode 1111 may output first input laser beam LB1_in in response to the first pulse signal PS1, and a second laser diode 1112 may output second input laser beam LB2 in response to the second pulse signal PS2. The first and second pulse signals PS1 and PS2 have pulse signal forms, as shown in FIG. 6, to output first and second input laser beams LB1_in and LB2_in for a predetermined time interval. In other words, the first and second pulse signals PS1 and PS2 indicate impulse signals for first time t1 and periodic signals that are zero for the next two hours t2.

In such an exemplary embodiment, there is provided a laser detecting system which adjusts output times of the first and second input laser beams LB1_in and LB2_in to prevent over-output and satisfy the standard for physical protection.

Figure 7:
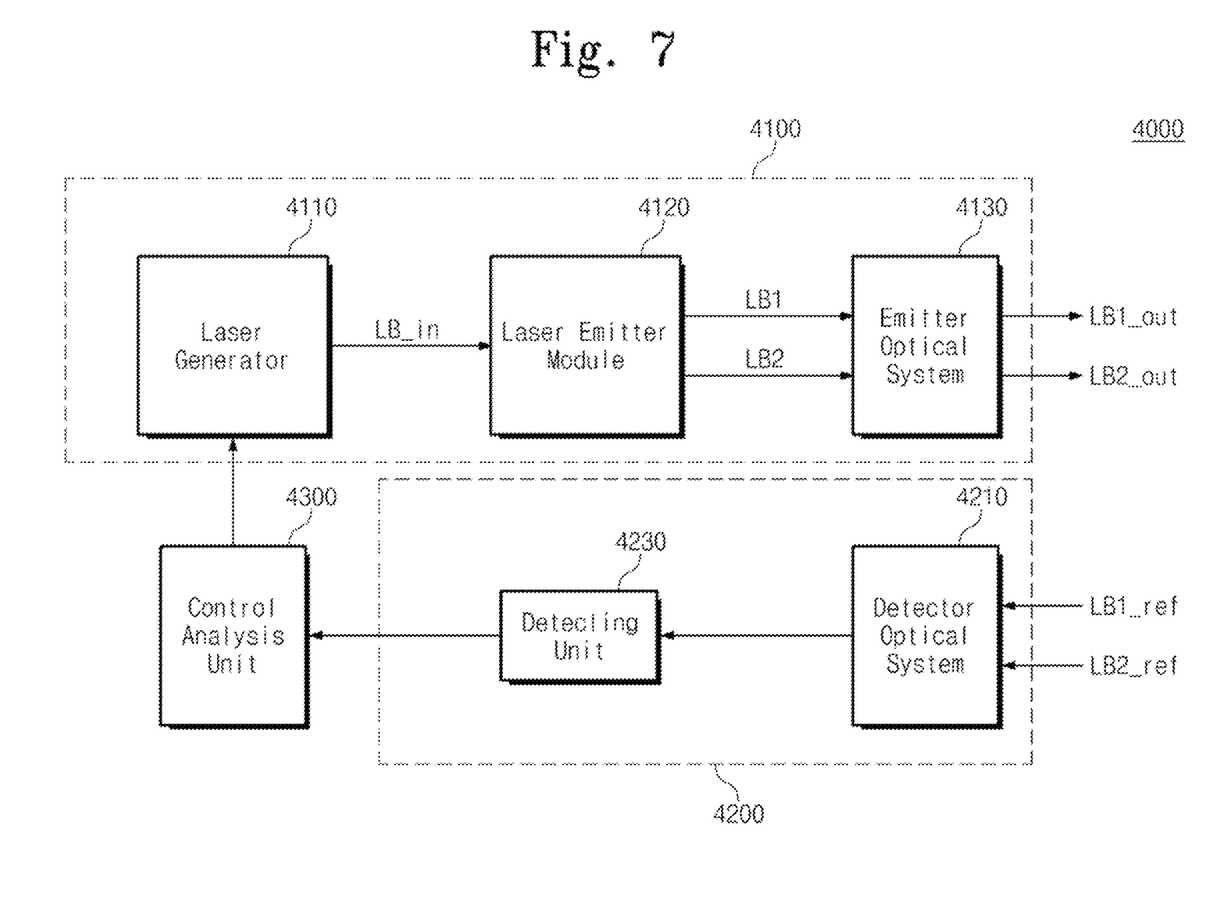
FIG. 7 is a block diagram of a laser detecting system according to still another embodiment of the inventive concept.

FIG. 7 is a block diagram of a laser detecting system 4000 according to still another embodiment of the inventive concept. Referring to FIG. 7, the laser detecting system 4000 includes a laser transmission unit 4100, a laser detection unit 4200, and a control analysis unit 4300. The laser transmission unit 4100 includes a laser generator 4110, a laser emitter module 4120, and an emitter's optical system 4130. The laser detection unit 4200 includes a detector's optical system 4120 and a single detecting unit 4230. Since the elements shown in FIG. 7 have been explained with reference to FIG. 1, they will not be explained in further detail. The description will focus on a difference between the laser detecting system 4000 in FIG. 9 and the laser detecting system 1000 in FIG. 1.

Unlike the laser detecting system 1000 in FIG. 1, the laser detecting system 4000 may detect an observation target located a long or short distance using a single detector. For example, the control analysis unit 4300 controls a plurality of laser emitters included in the laser emitter module 4120, based on different pulse signals, to output a plurality of laser beams having different radiation angles at predetermined time intervals. In other words, the control analysis unit 4300 outputs first output a laser beam LB1_out for long-distance detection during a certain time period and outputs second output laser beam LB2_out for short-distance detection during a certain period after the predetermined time.

The output times of the first and second laser beams LB1_out and LB2_out may be decided depending on their times of flight (TOF), respectively. The TOF is the time it takes for laser beam to travel to an observation target and return to an original position after the laser beam is reflected on the observation target. For example, TOF of the first output laser beam LB1_out for long-distance detection is longer than that of the second output laser beam LB2_out for short-distance detection. Thus, time when the first output laser beam LB1_out is output may be longer than that when the second output laser beam LB2_out is output.

According to the foregoing manner, a single detector may detect first and second reflected laser beams LB1_ref1 and LB2_ref2 in different time zones. In an exemplary embodiment, input laser beam LB_in output from the laser generator 4110 in FIG. 7 may a plurality of laser beams having different widths or a plurality of laser beams having a single width. In other words, the single detection unit 4230 detects reflection signals received in different time zones irrespective of widths of laser beams to observe an observation target located a long or short distance.

Figure 8:
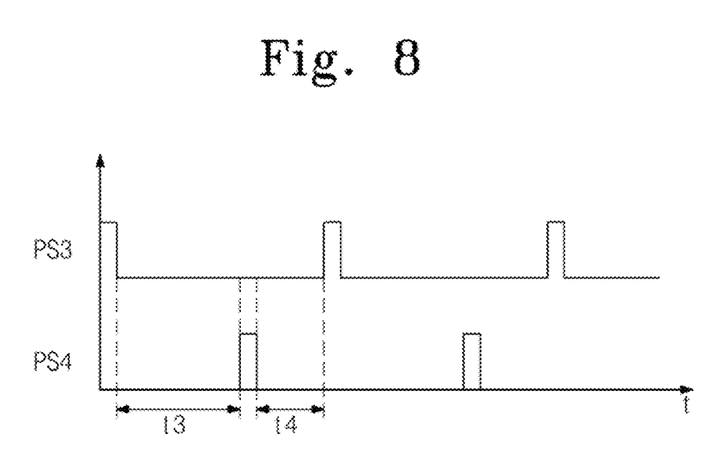
FIG. 8 is a timing diagram illustrating the operation of the laser detecting system in FIG. 7.

FIG. 8 is a timing diagram illustrating the operation of the laser detecting system 4000 shown in FIG. 7. Referring to FIGS. 7 and 8, the laser detecting system 4000 may operate based on third and fourth pulse signals PS3 and PS4. For example, the control analysis unit 4300 may control the laser transmission unit 4100 such that input laser beam LB_in becomes first output laser beam LB1_out having a first radiation angle θ1. In such an exemplary embodiment, the laser transmission unit 4100 outputs first output laser beam LB1_out during an impulse period of the third pulse signal PS3. Then, the laser transmission unit 4100 does not output the first and second output laser beams LB1_out and LB2_out during a third time t3. For the third time t3, the laser detection unit 4200 may detect an observation target by receiving first reflected laser beam LB1_ref reflected from the observation target.

After the lapse of the first time t3, the laser transmission unit 4100 outputs second output laser beam LB2_out according to the control of the control analysis unit 4300 for an impulse time of fourth pulse signal PS4. Then, the laser transmission unit 4100 does not output the first and second laser beams LB1_out and LB2_out during a fourth time t4. For the fourth time t4, the laser detection unit 4200 may observe an observation target located a short distance by receiving the second reflected laser beam LB2_ref reflected from the observation target.

In an exemplary embodiment, the third and fourth times t3 and t4 may be decided depending on TOF of the first and second output laser beams LB1_out and LB2_out. For example, the first output laser beam LB1_out may be laser beam for long-distance detection having a narrow radiation angle, and the second laser beam LB2_out may be laser beam for short-distance detection having a wide radiation angle. In this case, TOF of the first output laser beam LB1_out is longer than that of the second output laser beam LB2_out. The third time t3 may be decided based on the TOF of the first output laser beam LB1_out, and the fourth time t4 may be decided based on the TOF of the second output laser beam LB2_out.

According to the embodiment of the inventive concept described with reference to FIGS. 7 and 8, there is provided a laser detecting system that outputs laser beams having different widths or the same width are output at predetermined time intervals to detect observation targets located short and long distances. Thus, performance of the laser detecting system is enhanced and the cost thereof is reduced.

According to the above-described embodiments of the inventive concept, a laser detecting system includes a laser emitter module to output a plurality of laser beams having different radiation angles together. The laser detecting system may detect an observation target located a long or short distance using the plurality of laser beams. Thus, performance of the laser detecting system is enhanced and the cost thereof is reduced.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A laser detecting system comprising:
   a laser transmission unit configured to output a first output laser beam having a first radiation angle and a second output laser beam having a second radiation angle together;
   a laser detection unit configured to detect an observation target by receiving first and second reflected laser beams generated by reflecting the first and second output laser beams from an observation target; and
   a control analysis unit to control the laser transmission unit by receiving a detection result of the laser detection unit,
   wherein the first and second radiation angles are different from each other,
   wherein the laser transmission unit includes a laser generator and a laser emitter module, the laser generator configured to generate first and second input laser beams according to the control analysis unit, the laser emitter module configured to output the first and second output laser beams having the first and second radiation angles by receiving the first and second input laser beams.

2. The laser detecting system as set forth in claim 1, wherein the laser detection unit comprises:
- a detector optical system configured to receive the first and second reflected laser beams and concentrate the received first and second reflected laser beams to output a concentrated laser beam;
- a width division modulation filter configured to receive the concentrated laser beam and divide the received concentrated laser beam into the first and second reflected laser beams; and
- first and second detectors configured to detect the observation target by receiving the first and second reflected laser beams from the width division modulation filter, respectively.

3. The laser detecting system as set forth in claim 2, wherein the detector optical system includes an optical noise filter configured to remove optical noise included in the first and second reflected laser beams.

4. The laser detecting system as set forth in claim 2, wherein the first detector detects an observation target located at a predetermined distance or farther and the second detector detects an observation target located at a predetermined distance or shorter when the first radiation angle is smaller than the second radiation angle.

5. The laser detecting system as set forth in claim 1, wherein the control analysis unit receives the detection result from the laser detection unit and transmits the detection result to an external device.

6. The laser detecting system as set forth in claim 1, wherein the first and second output laser beams are output together for a first time interval and are not output together for a second time interval.

7. The laser detecting system as set forth in claim 1, wherein the control analysis unit controls the first and second output laser beams not to be output after the first output laser beam is output for a first predetermined time, and
wherein the control analysis unit controls the first and second laser beams not to be output after the second output laser beam is output for a second predetermined time after the lapse of the first predetermined time.

8. The laser detecting system as set forth in claim 7, wherein the first and second predetermined times are decided based on times of flight (TOF) of the first and second output laser beams.

9. The laser detecting system as set forth in claim 7, wherein the laser detection unit includes a single detection unit configured to detect the observation target, and
wherein the single detection unit detects the observation target by receiving the first reflected laser beam for a first time and detects the observation target by receiving the second reflected laser beam for a second time.

10. The laser detecting system as set forth in claim 1, the laser emitter module comprising:
- a first laser emitter configured to output the first output laser beam having the first radiation angle by receiving the first input laser beam; and
- a second laser emitter configured to output the second output laser beam having the second radiation angle different from the first radiation angle by receiving the second input laser beam having a width different from that of the first input laser beam,
wherein the first and second laser emitters output the first and second output laser beams together.

11. The laser detecting system as set forth in claim 10, wherein the first and second laser emitters include waveguides of different structures, and sizes of the first and second radiation angles are adjusted depending on the structures of the waveguides.

12. The laser detecting system as set forth in claim 10, wherein an output direction of the first laser emitter is different than an output direction of the second laser emitter.

* * * * *